(12) United States Patent
Druck

(10) Patent No.: US 6,477,553 B1
(45) Date of Patent: Nov. 5, 2002

(54) MEASUREMENT SCALE FOR NON-UNIFORM DATA SAMPLING IN N DIMENSIONS

(76) Inventor: Philip Druck, 481 Cape May, St. Englewood, NJ (US) 07631

( * ) Notice: Subject to any disclaimer, the term of this patent is extended or adjusted under 35 U.S.C. 154(b) by 0 days.

(21) Appl. No.: 09/326,084

(22) Filed: Jun. 4, 1999

Related U.S. Application Data

(60) Provisional application No. 60/115,752, filed on Jan. 13, 1999.

(51) Int. Cl.[7] .......................... G06F 17/17; G06F 17/14
(52) U.S. Cl. ...................... 708/313; 708/403; 708/405; 341/123
(58) Field of Search ................. 708/313, 405, 708/403, 401; 341/122, 123

(56) References Cited

U.S. PATENT DOCUMENTS

| | | | |
|---|---|---|---|
| 4,472,785 A | 9/1984 | Kasuga | 364/718 |
| 5,229,668 A | 7/1993 | Hughes, Jr. et al. | 307/605 |
| 5,243,343 A | 9/1993 | Moriyasu | 341/123 |
| 5,717,617 A | 2/1998 | Chester | 364/724.1 |

*Primary Examiner*—Tan V. Mai

(57) ABSTRACT

A method for sampling a signal for signal processing, such as calculating the coefficients of a Fourier or other transform of the signal. The sampling occurs at sampling points which are the union of sets of points, each set being points separated by regular intervals of $1/p_n$ where $p_n$ is a prime number. Where the signal is not accurately reconstructed from the sampled values the method recurses and increases the set of distinct primes. The invention relies upon the incommensurate nature of different primes to prevent the invention from degenerating into an inefficient sampling technique such as using regular intervals would provide. The scale, termed a D scale, is applicable to problems in diverse domains such as signal processing, including digital signal processing (DSP), image processing, scientific and engineering computational applications, data acquisition and statistical data analysis. Algorithms are provided that process an N dimensional Fourier and other kernel transforms of a multi-dimensional function using the non-uniform samples of the D scale along with Fast Fourier Transforms.

36 Claims, 12 Drawing Sheets

DIAGRAM 1:
UNIT INTERVAL, 1D, SINGLE-RESOLUTION PRIME NUMBER 3, DRUCK SCALE ™:

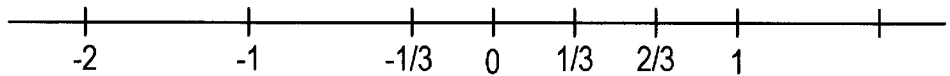
DIAGRAM 2:
UNBOUNDED, 1D, SINGLE RESOLUTION PRIME NUMBER 3, DRUCK SCALE™:
PRIME NUMBER: 3
FIG. 2
DIAGRAM 3:
UNIT INTERVAL, 1D, MULTI-RESOLUTION DRUCK SCALE™:
COMPOSITE SCALE:
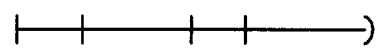
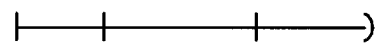 PRIME NUMBER. 2
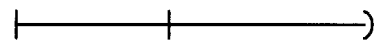 PRIME NUMBER. 3
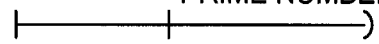 PRIME NUMBER. 5
FIG. 3

$$\Delta t * \Delta f \rightarrow 1/p * 1/T_p = 1/(T_p * p) = 1/N$$

SPECTRUM = FOURIERTRANSFORM [ PULSE[ t ], t, w ]

$\dfrac{1}{0.5 - I w}$   // NOTE: w=2 π f WHERE f IS FREQUENCY.
// NOTE: CALCULATED SPECTRUM WHERE I IS THE IMAGINARY 'i'

PLOT[ABS[SPECTRUM], {w, -10, 10}]
// NOTE: CALCULATED SPECTRUM'S AMPLITUDE FROM |w|<10

- GRAPHICS -   // NOTE: EXACT AMPLITUDE SPECTRUM

MATHEMATICA'S BUILT-IN "FOURIER" FUNCTION PERFORMS JUST
THIS CALCULATION:

DATA40 = TABLE[PULSE[0.025n], {n, -10, 50}];
// NOTE: UNIFORM SAMPLING OF SIGNAL AT THE RATE OF 40/SEC
(OR 1/40 INTERVAL).

LISTPLOT[ABS[FOURIER[DATA40] ], PLOTJOINED-> TRUE,
   PLOTRANGE-> { {0., 10.},{0., 2.5} } ]
// NOTE: AMPLITUDE SPECTRUM.

- GRAPHICS -

// NOTE: SAME AMPLITUDE SPECTRUM AS A FUNCTION
OF ω, ACROSS ENTIRE RANGE.

- GRAPHICS -

RESULTANT FREQUENCY D SCALE SUBSCALES - AMPLITUDES

```
CLEAR[ g ]
DO [ g [m] = N[ f [ m ] ], {m, LENGTH [ p ] } ];
<< GRAPHICS 'MULTIPLELISTPLOT'            // NOT: MATHEMATICA SPECIFIC.
LISTPLOT[ g [ 1 ], PLOTJOINED -> TRUE, PLOTRANGE -> ALL]
```

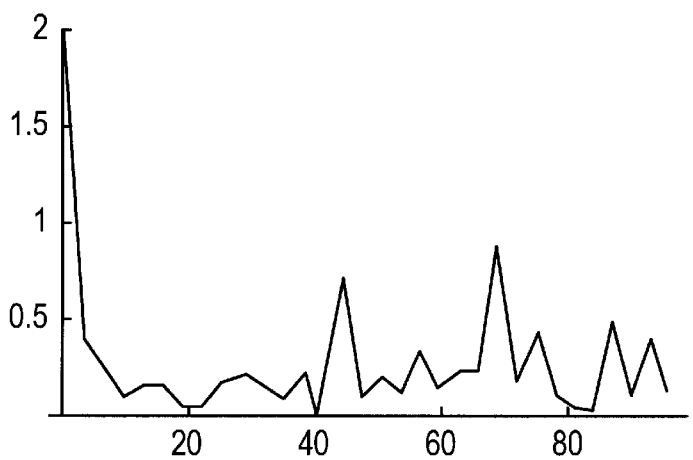

- GRAPHICS -          // NOTE: AMPLITUDE PLOT OF SPECTRUM
                         CONTRIBUTION FROM D SCALE PRIME 2.

*FIG. 12*

```
LISTPLOT[ g [ 2 ], PLOTJOINED-> TRUE, PLOTRANGE-> ALL]
```

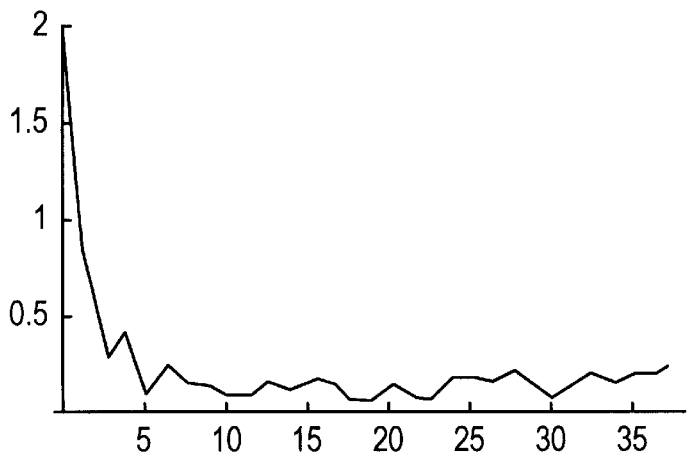

- GRAPHICS -          // NOTE: AMPLITUDE PLOT OF SPECTRUM
                         CONTRIBUTION FROM D SCALE PRIME 5.

*FIG. 13*

MEASUREMENT SCALE FOR NON-UNIFORM DATA SAMPLING IN N DIMENSIONS

This application claims the benefit of provisional application No. 60/115,752 filed Jan. 13, 1999.

FIELD OF THE INVENTION

This invention relates to methods for sampling objects. In particular it provides a system implementing a rigorous mathematical framework and provably correct practical algorithmic implementations for digitally recording a signal having any number of degrees of freedom.

BACKGROUND OF THE INVENTION

A physical or virtual object is recorded for application specific analysis by sampling or measuring it at various points. An object might be a one dimensional electrical signal, price history or other time series, a two dimensional image, a three dimensional vector field, or an N dimensional surface in, say, configuration space, momentum space, or phase space, all useful in physics. One important example is the current use of uniformly spaced samples of signals or images to analyze these objects for subsequent processing like filtering or convolution. This analysis involves calculating approximations to the Fourier transform, wavelet transform or other related transforms. The aggregate of sample points generated by the measuring process creates a mosaic from the original physical object. The degree of congruence of the mosaic to the original depends on the number of sample points used as well as on the judicious location of the sample points.

A classical example of such is recording of an audio signal for replay by sampling the signal amplitude at uniform time intervals less than half the period of the highest frequency present in the signal. The so-called Nyquist theorem assures that such a recording enables reconstruction of the original signal. If the uniform sampling occurred at a lesser rate, in many cases an attempt to replay the sampled signal would result in a distortion termed "artifacting" in which harmonics of the signal would not correctly reproduce.

Limited resources place constraints upon the generation of sample points. Therefore sampling is often a fairly expensive operation in terms of system resources consumed. Depending on the application, the number of sample points generated might be constrained by the resolution of the measuring equipment used (cost constraint), by the amount of storage available to save the samples (space constraint) as well as by the observation time window of opportunity to obtain the samples (time constraint). Thus, a set of samples can be regarded as a somewhat scarce resource. Therefore, each sample point should have impact and provide a maximal contribution of information content to the whole mosaic.

Since there is a cost associated with the generation of each sample point, some optimization of sampling is generally required. Particularly in the case of objects having periodically recurring patterns there is much redundancy in samples taken in uniform intervals. Or, more often, an object might have mostly unchanging features with little useful information content. But, say 10% of it contains volatile features of great interest. This has led to the use of non-uniformly spaced, or irregularly patterned, data samples.

For instance, a signal might exhibit rapid change (or volatility) in one concentrated region, but otherwise be fairly smooth. Or, an image might exhibit sharp edges as well as regions of unchanging, or predictable, patterns. In both cases, many sample points are required in certain concentrated intervals or areas where much information can be gleaned from the complex changes occurring there, while few sample points are needed elsewhere where little useful information can be extracted.

The number of sample points required using the standard uniformly spaced samples rises dramatically as the number of dimensions increases. Thus if a one dimensional signal requires $O(N)$ samples, then a two dimensional image would need $O(N^2)$ samples, a three dimensional $O(N^3)$ 3 samples and so on. (A quantity $Q(x)$ is said to be of order $N^k$, written $O(N^k)$, if $Q(x)/x^k$ is bounded.

What is required is a method to specify the manner of sampling an object wherein each the totality of samples provides comprehensive and non-redundant information about the object, while minimizing the number of samples required, especially as the dimension of the sampled object increases.

The following methods are generally known in the prior art:

- Accept the limitations of uniform sampling and utilize Fourier Transform approximation techniques like the Discrete Fourier transform and its FFT implementation;
- Approximate, generally via interpolation, non-uniformly spaced samples by uniformly spaced samples of sufficiently high resolution in critical regions tailored to the particular object;
- Using pseudo-random numbers, generate an irregular scale for measurements. A Monte Carlo method is typically used to implement this;
- Use multi-resolution wavelets; and
- Adaptively sample data.

The Fourier Transform plays a dual role in N dimensional data recording. First consider a one dimensional signal representing time variations of some variable of interest, say voltage or price. The Fourier expansion of a signal is capable of representing an analog signal by a sequence of complex numbered Fourier coefficients, the amplitudes and phases of the Fourier components, whereby the content of a signal with a bounded frequency spectrum is accurately represented by a discrete data series. This itself results in effective data compression, especially for signal having significant periodic components. Secondly, the determination of the Fourier coefficients of the signal is determined by sampling of the signal, which brings one back to the need for the present invention.

The standard technique is to employ a Discrete Fourier Transform (DFT) as a substitute for the Fourier Transform. Furthermore the FFT or Fast Fourier Transform has been developed, which is an efficient implementation of the DFT. The DFT, therefore is an approximation that inherently distorts the spectrum generated by the Fourier transform. Nevertheless, it is tolerated as the most commonly used digital and image processing technique because it is analytically tractable and readily implemented on diverse hardware/software platforms.

The approximation, generally via interpolation, of non-uniformly spaced samples by uniformly spaced samples of sufficiently high resolution also distorts the calculated spectrum. But it is also potentially wasteful of sample points since it requires uniformly spaced samples as anchors around which irregularly spaced samples are interpolated. It is also difficult to implement its mathematics. Indeed, the overwhelming general practice is still to use the first approach.

The use of pseudo-random numbers is analytically or mathematically difficult to describe, if not pragmatically intractable. That is, it is not readily describable mathematically, say as a set of equations. A mathematical description is generally needed in practice, to develop algorithms that automatically map sample points to the irregularly spaced random points. It is also computationally complex because the deltas, or differences between each sample point and neighboring random points, generally must be recalculated because the random points used might not be reproducible.

Another, relatively new, general technique is multi-resolution analysis. This involves splitting the stream of possibly non-uniformly spaced data into streams of different resolution. In some circumstances, this technique is also referred to as "decimation". Wavelets also use a multi-resolution analysis. The use of multi-resolution wavelets tries to solve the problem of mathematically decomposing non-stationary or highly irregular signals and images, into simpler components on multi-tiered scales. But the approach is generally difficult to implement in practice. Although there have been claims for very specific applications, its effectiveness vis-a-via standard DFT based techniques for general applications is not apparent. Indeed, the 1965 Cooley-Tukey FFT algorithm immediately paved the way for the revolution in medical imaging that accelerated in the 1970s. Such a similar impact is not apparent, even more than 13 years after the framework for wavelets was articulated in a coherent manner.

There were other attempts preceding wavelets, at calculating the Fourier transform of non-stationary objects, notably the Gabor Transform. But again, these techniques were not general enough to be of use off-the-shelf, as the FFT. Indeed, a major motivation underlying wavelets was to supplant the Gabor transform method with a multi-resolution approach.

Adaptive sampling has been used in many specialized applications in connection with the FFT. Its use of specialized and sometimes customized sampling algorithms (to decide on how to adapt to data changes) limits its usefulness as a general purpose tool. It requires much a priori knowledge of the specific data set being sampled.

U.S. Pat. No. 5,708,432, appears to disclose a sampling digitizer with a sampling master clock divided by a factor k which is derived from prime integers. The '432 patent is concerned with sampling a periodic function, where the number of samples desired during each cycle exceeds the response ability of the sampling system. A technique is used in which fewer samples are taken from successive cycles of the signal and are combined in order to simulate the effect of many samples taken during one cycle. To do this, a clock is divided by an integer K which is varied according to an algorithm. N consecutive samples are taken over M cycles of the signal. Coherent signaling is achieved when the signal frequency and the divided clock frequency are relatively prime. The particular algorithm finds the relatively prime fraction by selection from a Farey series of a given order. Unlike the present invention, the '432 invention selects a set of samples separated by constant interval. The use of relatively prime ratios to guarantee that the same points are not selected on a perfectly periodic signal is different from the present technique, which would work to sample even a pulse, and does not require that the signal be periodic.

An abstract in the prior art makes reference to sampling employing prime numbers. Proceedings the European Signal Processing Conference held in Trieste on Sep. 10–13, 1996. The abstract states:

We demonstrate that it can be advantageous from a computational point of view to use a two-stage realization instead of a single-stage realization for sample rate conversions with prime numbers. One of the stages performs a conversion by a factor of two . . . . The other stage changes the sample rate by the rational factor N/2 . . . .

U.S. Pat. No. 5,243,343 uses variable time interval data sampling. See col. 5, line 18–19. U.S. Pat. No. 5,444,459 is essentially identical with the '343 patent.

Other prior art shows
1. non-linear sampling without reference to the prime integer algorithm of the present invention (U.S. Pat. Nos. 4,188,583; 4,142,146; 4,903,021;and 5,229,668 [FIG. 3])
2. the use of prime numbers in Hartley transform processors (U.S. Pat. No. 4,062,060; Boussakta et al., 24 Elect. Ltrs. No. 15, pp. 926–28 (Jul. 21, 1988); 136 IEE Proc. Pt. G, No. 5 (October 1989) pp. 269–77.)
3. Other patents of interest include U.S. Pat. No. 5,712,809 entitled "Method and apparatus for performing fast reduced coefficient discrete cosine transform"; U.S. Pat. No. 5,682,524 entitled "Databank system with method for efficiently storing non-uniform data records"; U.S. Pat. No. 5,497,152 entitled "Digital to digital conversion using non-uniform sample rates"; U.S. Pat. No. 4,271,500 entitled "Device for converting anon-uniformly sampled signal with short-time spectrum to a uniformly sampled signal"; U.S. Pat. No. 5,712,635 "Digital-to-analog conversion using non-uniform sample rates"; U.S. Pat. No. 4,999,799 entitled "Signal processing apparatus for generating a Fourier transform"; and U.S. Pat. No. 4,969,700 entitled "Computer aided holography".
4.

BRIEF DESCRIPTION OF THE INVENTION

The invention relates to signal processing, primarily digital signal processing employing N dimensional data sampling required to extract information about the object for subsequent processing. In order to extract information from a signal it is sampled at discrete points and the sampled values are fed into calculation algorithms. For example the sampled values may be used to calculate the coefficients of a Fourier transform of the signal by known algorithmic techniques, thereby extracting useful information about the Fourier spectrum of the signal. Other transforms may be calculated using other kernel functions to generate Radon, Hartley, or discrete sine and cosine transforms. The discrete points at which sampling occurs may for example be discrete times for a signal that varies with time. As a specific example of the utility of the invention, it is utilized to process an N dimensional Fourier and related transform using the non-uniform samples of the D scale and FFTs. This decomposition of a Fourier transform into a series of FFTs will be detailed later.

This invention is concerned with the selection of the values of the discrete points at which sampling occurs. Since most signals are composed of a few periodic components, there is much redundancy when the sampling takes place at regular intervals. Sampling at regular intervals also leads to artifacting, i.e. false data caused by the confusion of an interval with its harmonics. On the other hand it is algorithmically simpler to sample at regular intervals and it is necessary to keep the calculations manageable.

This invention provides a method including algorithms to generate an irregularly spaced set of sampling points which still provides the practical calculation advantage of uniform sampling. This methodology can also be tuned or configured to generate an approximation of a truly (pseudo)random set of points. Further, it can be tailored such that the resolution or width between neighboring points in the set is always within pre-specified maximum and minimum bounds. That is useful when sampling different data sets, each with a different number of significant digits. For a one dimensional situation, i.e. where the signal is a function of one parameter such as time, the set of sampling points is composed as the union of n sets of points, each set being points separated by regular intervals of $1/p_n$ where $p_n$ is a prime number. Each set is denoted a "scale" for prime number $p_n$. The union is therefore characterized by a set $\{P_n\}$ of distinct prime numbers. The union is intrinsically non-periodic. And for even a small set of distinct primes the distribution of points in the union appears almost random. This union is used to determine where the signal is sampled. The points at which sampling takes place is not dependent on the values of the signal. If the signal cannot be accurately reconstructed from the sampled values one merely recurses and increases the set of distinct primes, which is always possible because of their infinite number. Alternately, there might be a-priori knowledge of an object's information bandwidth. Then the prime numbers used to generate the set of points can be pre-determined, such that the highest prime number just exceeds the known, effective, bandwidth. For example, audio applications generally require bandwidth ranges of 5–20 KHz. Therefore there is no need to use prime numbers of order $10^5$ when this application domain only uses an effective bandwidth of order $10^4$.

The invention may be implemented in a real-time measurement operation by running a series of clocks ticking at intervals characterized by $1/p_n$ for the $n^{th}$ clock, and sampling the signal at each clock tick. For a more than one dimensional situation, where the signal is characterized by multiple parameters, each parameter is treated as in the one dimensional case, and the sampling space is treated as the Cartesian product of one in dimensional spaces. The invention relies upon the incommensurate nature of different primes to prevent the invention from degenerating into an inefficient sampling technique such as using regular intervals would provide.

Although the invention is characterized by the use of primes, there are other techniques that may be used to generate the sampling points. The key features are that the points are derived from the union of sets of points generated by simple calculations and the union avoids a periodic structure. Another variation of this sampling technique is to offset the points associated with each prime scale. The offsets might be random or also prime numbers. The intent would be to better capture phase information in data analysis.

An efficient method is presented for sampling and thereby enabling the recording of, or measurements of objects, which is successful regardless of the irregularity or periodicity of the object. The sampling occurs at values of an independent variable. For example, where the sampled object is an electrical signal, the independent variable could be time. Where the sampled object is a multidimensional physical object, the independent variable could be a spatial coordinate parametrizing the space in which the physical object is embedded. Collectively, the points or values of the independent variable at which samples are taken is termed a "scale". This terminology is consistent with the usual association of a scale with the ruler used to measure quantities.

This new measurement scale is presented with special properties that makes it particularly effective for sampling non-uniform data. The new scale is contrasted with the familiar ruler scale as a point of reference. The new scale is based, fundamentally, on the existing mathematics of set theory, real analysis of the continuum, and number theory. That is, it applies theoretical knowledge from set theory, real analysis and number theory to solve practical problems related to data sampling. The theoretical framework provides the necessary rigorous foundation to guarantee that this new scale yields provably correct results in all applications.

The new scale, herein termed a D scale, is applicable to problems in signal processing, including digital signal processing (DSP), image processing, scientific and engineering computational applications, data acquisition and statistical data analysis, to mention a few application domains.

The D scale can also be configured or tailored to match the varying bandwidth, resolution or accuracy, and point distribution requirements of the widely disparate application domains mentioned above. Specifically, the minimum and maximum resolutions of any particular D scale can be guaranteed by an algorithm, discussed later, that determines which prime scales to include when a D scale is constructed. Further, the D scale can be constructed with prime scale components such that the distribution of its points is made somewhat random for certain applications. Or, the points can be distributed to accentuate the multi-frequency components of an application domain, resulting in more points towards the center of a unit interval, and tapering off at the edges. This flexibility in generating point distributions is effected by including more or fewer prime scales in a D scale.

The invention employs a method, or an algorithm, to perform nonuniform sampling. It can be embodied or implemented as a product (hardware based, software based or combined hardware/software) to implement nonuniform sampling.

Among possible commercial applications are the following:

Real-time Data Acquisition

The D scale, along with its sampling algorithm, improves the efficiency of real-time data acquisition. Data acquisition is at the heart of many processes in such diverse fields as seismology, oceanography, medical imaging and process control, to name a few. The D scale and its algorithm samples judiciously, say when volatile data is detected, and not when the data is uninteresting. In contrast with standard techniques that leads to reduced cost of data acquisition since fewer sample points are generally used. The effectiveness of the sampling process is improved since useful samples are generated, not the many extraneous samples of a uniformly spaced procedure.

Post-acquisition Data Analysis

The D scale can also be used to analyze data already generated by a data acquisition or sampling device. For example, the D scale is used to generate a closed form expression for the Fourier Transform (described later). Using the closed form expression, it is then possible to quantify the bias in not using points in regions that are not varying enough to warrant attention. Therefore, it can effectively filter the acquired data or samples to focus on the more significant data sections, thereby reducing the quantity of data that must be processed to characterize the object sampled. In this manner the D scale acts as a means for data compression. This has application in the analysis of large quantities of data produced by NMR or tomography devices, and reduces the burden of analyzing such data. The same is true of the large quantity of data produced by seismography measuring apparatus, as an example. Further, other application domains produce resonance shapes which might contain only 10% useful information content.

Transforming Irregular Data into Periodic Components

The D scale can be used to partition an original, irregularly patterned data set to create multiple components. Each component contains points which, although not periodically patterned, are all reciprocal multiples of the same prime number $1/p_k$, which is what bounds them to the same prime scale. Then, because the points on each prime scale is bandlimited by $p_k$, the set of points on each prime scale can be decomposed via standard Fourier analysis into periodic components. Thus, the D scale enables a two stage decomposition. The first stage decomposes the original set of irregularly spaced points into sets of uniformly spaced and bandlimited points, each associated with a prime scale. Then the second stage decomposes each bandlimited decomposition into the usual periodic components of a Fourier series. Also, each partition has a different resolution $(1/p_k)$ such that the components form a nested set of resolutions.

Characterization of Noisy data

The D scale can filter random noise into periodic components thereby providing a useful characterization of the data, which reduces the effect of random noise in the data.

BRIEF DESCRIPTION OF THE DRAWINGS

FIG. 2 shows an unbounded, 1D, single resolution prime number 3, D scale.

FIG. 3 shows a unit interval, 1D, multi-resolution D scale comprising a composite scale using the prime numbers 2, 3 and 5.

FIG. 7 shows this effect.

FIG. 12 depicts the amplitude plot of the spectrum contribution from the D scale using prime 2.

FIG. 13 depicts the amplitude plot of the spectrum contribution from the D scale using prime 5.

DETAILED DESCRIPTION OF PREFERRED EMBODIMENTS

Figure 1:
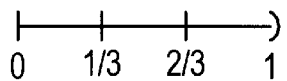
FIG. 1 shows a bounded, 1D, single resolution prime number 3, D scale.

The D measurement scale has three components; a set of scale points used-to select data samples, a set of pre-calculated distances between nearest neighbors and an algorithm that efficiently associates or maps sample points to the scale points. The rigorous mathematical underpinning of the D scale involves two fundamental mathematical concepts; the notion of a one-to-one correspondence between points in two sets and that of the measure of a set. The measure of a set corresponds roughly to the inherent concept of size, e.g. length or area, but is defined precisely to cover sets whose inherent size is not obvious. The Lebesgue measure of a one dimensional set is a familiar example of the use of the concept of measure, and permits assigning a measure for such oddities as the set of all irrational points, etc.

The familiar ruler uses a subset of rational numbers (i.e., numbers that can be expressed as fractions, typically multiples of some high inverse power of two, which defines the resolution of the scale) for measurements. The rulers sampling algorithm finds the multiple of the inverse power of two that is nearest to the sample point. For example, an irrational number is approximated by a rational number of the required resolution.

The D scale satisfies several criteria for the utility of a measurement scale. It has a. A degree of regularity, or of a uniform pattern, of the scale points for ease-of-implementation, that is to say the definition of the scale points is simple to calculate, b. A degree of irregular pattern of scale points to accommodate clustering of data points, that is to say the scale points exhibit a highly non-uniform distribution, c. Multi-resolution capability to accommodate different orders of magnitudes in sample point resolutions, d. Minimal number of scale points needed for effective measurement.

Note that the familiar ruler meets criteria a and c, providing uniformly spaced markings and multi-resolution as powers of 10. In contrast, a scale whose points are randomly selected only meets criteria b above. The D Scale meets all four criteria indicated above, therefore making it most effective for nonuniform data sampling.

Working Description of D Scale Invention

The D measurement scale is described both analytically and geometrically. Then, rigorous mathematical proofs are presented on the correctness of its operation. After that, the scale's sampling technique is described and its utility proven. Finally, useful and commercially viable examples are provided illustrating uses of the D scale.

The N-Dimensional D scale consists of selected points on the N dimensional rational number coordinate space (or grid). This scale will be shown to meet each of the criteria set forth for the D scale. It will also be shown to be effective in sampling and/or processing non-uniformly spaced data.

The set of measurement points in a D scale is described in stages. First, the one dimension (1D) scale is described. This is then generalized to a description of the N dimensional scale.

The 1D measurement scale is multi-resolutional, i.e. it is comprised of multiple scales of different resolutions. The 1D, unit interval scale with a single resolution is first described. Then, the unbounded 1 D scale with a single resolution is described. That is followed by the multi-resolution, unbounded, 1D scale.

Consider a one dimensional bounded single resolution scale, e.g. the set of points on the 1D, half-closed interval $[0, 1)$, that are multiples of some prime number. Or more formally, consider the set of points $S_{p_{io}, 1)} = \{x \in [0, 1): x=n/p, n=1..p-1, p \in \{\text{prime numbers}\}\}$, which is depicted in FIG. 1 for the prime number 3.

Next, extend this definition to an unbounded set of points by replicating the set of points on [0,1) across the entire number line. More formally, consider the set of points $S_p = \{x \in (-\infty,\infty) : x = j + n/p, j = -\infty \ldots \infty, n = 1..p-1, p \in \{\text{prime numbers}\}\}$. $S_p$ is referred to as the $p^{th}$ prime resolution D Scale. This is depicted in FIG. 2.

Next consider a multi-resolution bounded D scale. Consider N 1D, unit interval, prime resolution scales, each corresponding to a different prime number. A multi-resolution D Scale is then the superposition or union of measurement points from each of these N prime resolution scales. Formally, using the previous definition of $S_{p[0,1)}$, the 1D multi-resolution D Scale is: $S_{I[0,1)} = \{x \in \cup S_{p[0,1)} : p = p_1 \ldots p_n, p_i \in \{\text{prime numbers})\}$, or equivalently, $S_{I[0,1)} = \cup S_{p[0,1)}$ where $p = p_1 \ldots p_n, p_i \in \{\text{prime numbers}\})$. This is shown in FIG. 3.

Next, consider N 1D, unbounded, prime resolution scales, each corresponding to a different prime number. A multi-resolution D Scale is then the superposition or union of measurement points from each of these N prime resolution scales. Formally, if $S_p$ is as defined previously, then the 1D multi-resolution D Scale is $S_I = \{x \in \cup S_p : p = p_1 \ldots p_n, p_i \in (\text{prime numbers }) \}$, or equivalently, $S_I = \cup S_p$ where $p = p_1 \ldots p_n, p_i \in (\text{prime numbers })$. This is shown geometrically in FIG. 4.

Summarizing, each measurement point in the multi-resolution 1D D Scale is located by its three coordinates (p,i,j), where p is the prime resolution scale in which the point is located, i is the integral interval on the prime resolution scale p, and j is the fraction of the prime number in that $i^{th}$ interval. Therefore, if a measurement point's location on the rational number based ruler is d, then the relation of these scales is $d = i + j/p$.

Progressing now to multidimensional examples, a single resolution, n dimensional, D scale is defined for the bounded unit hypercube. First, consider Cartesian cross product of the measurement points on the one dimensional half-closed interval [0, 1), namely, $S_{pN[0,1)} = \Pi S_{p[0,1)} = S_{p[0,1)} \times \ldots \times S_{p[0,1)}$ (N times). An N dimensional point on the unit hypercube D Scale is then described as $X \in \Pi S_{p[0,1)} \rightarrow X = (x_1 \ldots x_N) \rightarrow x_j \in S_{p[0,1)}$.

This has also been extended to the unbounded hypercube. First, consider the measurement points on the one dimensional half-closed interval [0, 1), previously defined as $S_{p[0,1)}$. Define the Cartesian cross-product of N of these 1 dimensional unbounded scales as follows: $S_{pN} = \Pi S_p = S_p \times \ldots \times S_p$ (N times). An N dimensional point on the unbounded unit hypercube D Scale is then described as $X \in S_{pN} \rightarrow X \in \Pi S_p \; X = (x_1 \ldots x_N) \rightarrow x_j \in S_p$.

This in turn is expandable into a multi-resolution, N dimensional, D Scale. For example, an N-dimensional multi-resolution scale on a unit hypercube is created by the union of N dimensional, unit hypercube, prime resolution scales, for each prime number included in the scale. Formally, the N dimensional, multi-resolution, D Scale is $S_{N[0,1)} = \{X \in \cup S_{pN[0,1)} : p = p_1 \ldots p_n, p_i \in \{\text{prime numbers}\}\}$, or equivalently, $S_{N[0,1)} = \cup S_{pN[0,1)}$ where $p = p_1 \ldots p_n, p_i \in \{\text{prime numbers}\}\}$, or equivalently, $S_{N[0,1)} = (x_1 \ldots x_N) : x_i \in \cup S_{p[0,1)}$ where $p = p_1 \ldots p_n, p_i \in \{\text{prime numbers}\}\}$.

An N-dimensional multi-resolution scale on an unbounded hypercube is created by the union of N dimensional, unbounded, prime resolution scales, for each prime number included in the scale. Formally, the N dimensional, multi-resolution, D scale is: $S_N = \{X \in \cup S_{pN} : p = p_1 \ldots p_n, p_i \in \{\text{prime numbers}\}\}$, or equivalently $S_N = \cup S_{pN} : p = p_1 \ldots p_n, p_i \in \{\text{prime numbers}\}$, or equivalently, $S_N = \{(x_1 \ldots x_N) : x_j \in \cup S_p : p = p_1 \ldots p_n, p_i \in \{\text{prime numbers}\}\}$.

I have accomplished rigorous proofs of three theorems that demonstrate properties establishing the utility of the D scale. The first property is the scale points' uniqueness. The second is the scale points' ability to completely cover a line (in 1dimension) or region (in N dimensions) without overlap. And the third property is the scale points' capability to provide any desired resolution through nesting of prime resolution scales. These properties are direct consequences of the intrinsic properties of prime numbers. Indeed, that is why only prime numbers are included in the D Scale. But more generally, any other set of numbers should have these characteristics as well. Specifically, using random or prime numbered offsets should be sure to obey these theorems. These theorems underlie the validity of the scale and provide the necessary confidence that the scale always performs its measurement function correctly.

Theorem 1 is the Fundamental Uniqueness Theorem

Each D Scale point is in one and only one prime resolution scale. That is, for any pair of N-th dimensional prime resolution scales $S_{i,N}$ and $S_{j,N}$, in the D Scale it follows that $S_{i,N} \cap S_{j,N} = \emptyset$ where I, j $\in$ {prime numbers}.

Theorem 2 (One Dimension)

The set of D Scale point neighborhoods covers the number line $(-\infty,\infty)$ (i.e., R1). And the covering does not contain any overlapping neighborhoods: $\cup Np_{i,j} = (-\infty,\infty)$.

Corollary 1 (1 Dimension): Any sample point can be assigned or mapped to one and only one D Scale point.

Theorem 2 (N Dimensional)

The set of D Scale N dimensional point neighborhoods covers the $R^N$ continuum. And the covering does not contain any overlapping neighborhoods. $\cup_{Npi,j} = \infty^N$. (These neighborhoods are defined below.)

Corollary 1 (N Dimensions): Each sample point can be assigned to one and only one point neighborhood in the D to Scale.

Definition: The resolution (or span) of a D Scale is the maximal distance between adjacent points such that they are distinguishable. The gaps between adjacent D Scale points varies. But there are applications where the maximal gap between adjacent points must be guaranteed to within a specified resolution.

Theorem 3 (Infinitely Scalable Resolution)

The span of the D Scale decreases to 0 as the prime resolution tends to $\infty$. Conversely, the prime resolution tends to $\infty$ as the span decreases to 0. This theorem guarantees that the resolution of a D Scale can be adjusted to as small a value as required, by incorporating higher prime resolution scales.

Corollary 4: A prime resolution scale can always be found to implement a specified maximum gap on an N dimensional D scale. Additionally, a theorem is proved Theorem 4: A necessary condition for neighboring scale points to always have a minimum interval, $\epsilon$, between them, is that:

$$|1/p_i - 1/p_{i+1}| < \epsilon$$

for all $p_i$ prime scales.

This is readily proven using mathematical induction, since:

$$|1/p_0 - 1/p_1| < \epsilon \rightarrow |n/p_0 - m/p_1| < \epsilon n < p_0, m < p_1.$$

If $$|1/p_i - 1/p_{i+1}| < \epsilon \rightarrow |n/p_k - m/p_l| < \epsilon n < p_k, m <_{pl}$$

Then:

$$|1/p_{i+1} - 1/p_{i+2}| < \epsilon \rightarrow |1/p_{i+1} - 1/p_{i+2}| < \epsilon \rightarrow |n/p_k - m/p_l| < \epsilon n < p_k, m < p_l$$

by the induction condition. And $$|1/p_{i+1} - 1/p_{i+2}| < \epsilon \leftrightarrow |n/p_{i+1} - m/p_{i+2}| n < p_{i+1}, m < p_i$$

Therefore $|n/p_{k+1} - m/p_l| < \epsilon$ $n < p_{k+1}$, $m < p_l$ $l < k+1$. Therefore the induction hypothesis is true for case k+1.

Therefore a D scale can be constructed following an induction argument. Start with the lowest primes that satisfy the constraint. Then add a third prime that satisfies the constraint with the second prime, and onward. This constructs a D scale layer by layer, or prime subscale by subscale.

DETAILED DESCRIPTION OF A PREFERRED EMBODIMENT OF THE ALGORITHM FOR IMPLEMENTING A D SCALE

Non-Uniform Sampling of Data Using the D Scale sampling can be performed in real-time, as each data point is individually received. Or sampling can be performed after a collection of data points is first gathered. In either case, an algorithm is presented to "measure" or sample data points using the D Scale.

This algorithm is first presented for 1 dimensional data sets and then generalized to N dimensional samples. The algorithm is presented as a theorem, with the proof of its utility relegated to the examples.

Theorem 5 (Sample Measurement Theorem in 1D)

A sample point x can always be assigned, or mapped, to one and only one point in a D Scale according to the following algorithm:

Start from the lowest prime resolution scale in the D Scale. Determine if the sample point is in the neighborhood of any of the points in the D Scale. If it is, then assign that scale point to it. Otherwise, continue to the next prime resolution and perform the same search for nearest measurement point. The sample point must eventually find itself in the neighborhood of some point in the D Scale. Formally:

for ($P_i$ where $P_i = p_l \ldots p_n$, $p_i \in$ {prime numbers in this D Scale})

Consider a sample point x, expressed as a decimal. Then x=a.b, where a is an integral part of the decimal, and b is the fractional part. The integral part of this sample, a, is the a-th interval on the prime resolution scale $P_i$. The fractional part, b, is used to determine which multiple of $1/P_i$ to use, as follows. Consider: $(.b)*P_i$ The floor function extracts the greatest integer j less than or equal to f: $j = \lfloor (.b)*Pi \rfloor$ Therefore: $j/P_i = < .b$ Also: $.b = < (j+1)/P_i$ Otherwise, $j+1 = \lfloor (.b)*Pi \rfloor$ which contradicts the above.

Thus: $j/P_i = < .b = < (j+1)/P_i$

The sample point's remaining distance from $(j/P_i)$ is:

$$\epsilon = b - (j/P_i)$$

As verification, the sample point can be located on the $a^{th}$ interval of the $j^{th}$ element of prime resolution scale $P_i$. Or:

$$x = a + (j/P_i) + \epsilon = = a.b$$

Next, determine if the sample point is in the neighborhood of either i th or j+1 st measurement points of prime resolution $P_i$; $P_{i,j}$ or $P_{i,j+1}$ respectively.

Let $\delta_{j,R}$ = distance of $P_{i,j}$ to its nearest right neighbor among the D Scale measurement points. $\delta_{j+1,L}$ = distance of $P_{i,j+1}$ to its nearest left neighbor among the D Scale measurement points.

If ($\epsilon = < \delta_{j,R}/2$)

then measurement point $P_{i,j}$ is selected as that sample's nearest approximation. That D Scale point is used in subsequent calculations to represent the original sample point.

Else if ($\epsilon = < \delta_{j+1,L}/2$)

then measurement point $P_{i,j+1}$ is selected.

Else continue the same logic, using the next prime resolution scale.

Theorem 4 (Sample Measurement Theorem in N Dimensions)

An N dimensional sample point can always be assigned, or mapped, to one and only one N dimensional point in a D Scale according to the following algorithm:

Start from the lowest prime resolution scale in the D Scale. Determine if the sample point is in the neighborhood of any measurement points in the D Scale by examining the 1D neighborhoods of each of its coordinates, at the same resolution scale. If it is in the neighborhood of a scale point, then assign that scale point to it. Otherwise, continue to the next prime resolution and perform the same search for nearest measurement point. The sample point must eventually find itself in the neighborhood of some point in the D Scale.

Formally:

For ($P_i$ where $P_i = p_l, \ldots p_n$, $p_i \in$ {prime numbers in this D Scale})

Consider an N dimensional sample point X, expressed as:

$$X = (x1, x2, \ldots x_N)$$

Then apply the 1D algorithm to each coordinate $x_i$ to that coordinate point's nearest 1D scale point.

Coordinates at different dimensions $x_l$ will find their neighborhood at different prime resolutions $x_{pk}$.

Eventually each coordinate must find its neighborhood.

The sample point will then be assigned to the scale point as:

$$X = (x1, x2, \ldots x_N) \rightarrow (X_{p1}, X_{p2} \ldots X_{pN})$$

General Properties of the D Scale

Figure 6:
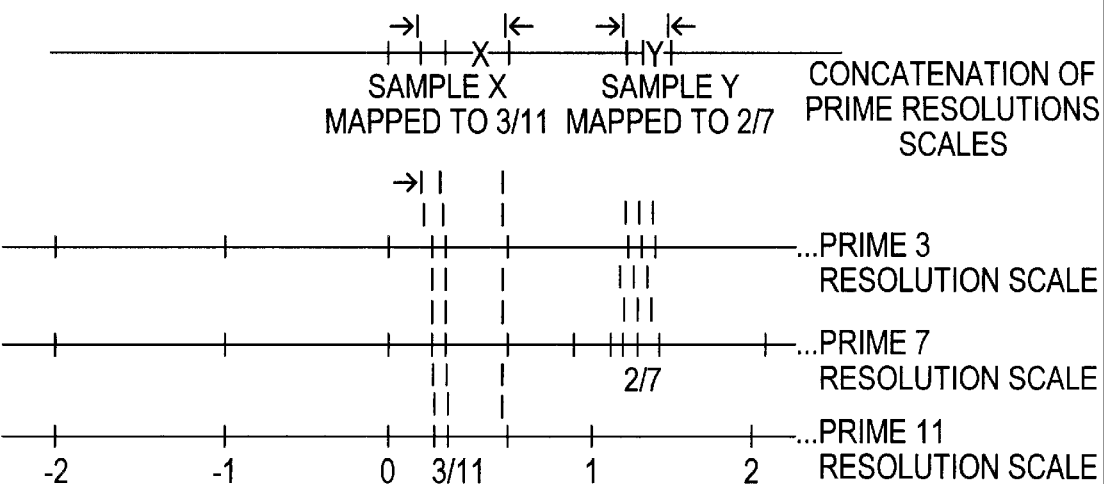
FIG. 6 depicts the 1 dimensional component of an N dimensional D Scale comprising potentially an unlimited number of prime resolution scales. The union of points on these scales creates an irregular pattern of points on the composite D Scale.
Figures 7, 8:
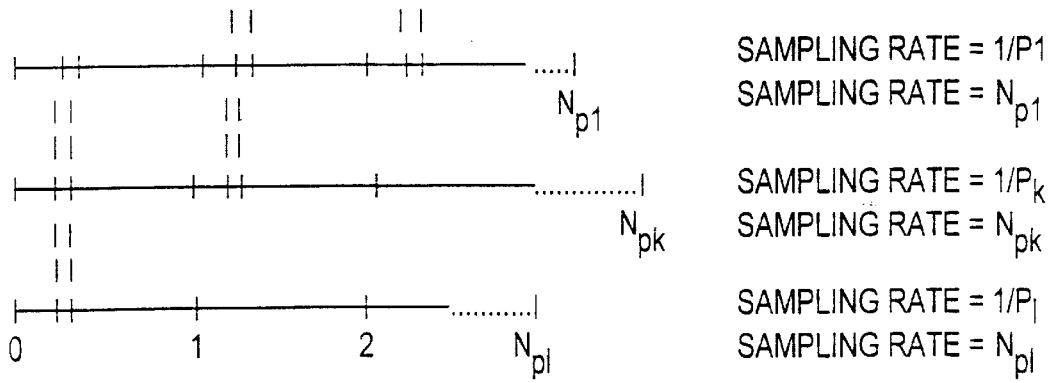
FIG. 7 depicts a one dimensional multi-resolution D scale bounded by sampling time. The spectrum's boundary is determined by the prime number of the resolution used.
FIG. 8 depicts the reciprocity theorem.

FIGS. 6 and 7 summarize the key properties of the N dimensional D Scale, even as the 1 dimensional case is highlighted. One property is that the scale is composed of potentially an unlimited number of prime resolution scales each of which has points that are uniformly spaced. The union of points on these scales creates an irregular pattern of points on the composite D Scale. The availability of a countable infinite number of prime resolution scales leads to any desired resolution. Further, the scale can be tailored to the application domain of interest such as voice or images. Thus, the resolution between neighboring points can be made bounded, or the point pattern generated to be more or less random.

Another property is that each scale point has a neighborhood about it that does not overlap with the neighborhood of any other scale point. This property leads to a measurement algorithm that is guaranteed to identify the neighborhood within which a sample point resides, in order to map it to a point on the scale. FIG. 6 illustrates this effect. Thus, it is not possible for a sample point to "fall-through the cracks" and not map to any scale point.

Yet another property is that the spectrum of an object's (e.g., signal, image) sample points on any one prime scale is necessarily band limited. The spectrum's boundary is determined by the prime number of the resolution used. FIG. 7 shows this effect.

Contrasting this scale with the standard ruler, it requires far fewer measurement points than a ruler of the same resolution or depth. Thus, at any depth measured by the number of decimal places (and therefore resolution), there are fewer ruler points per unit interval than with the standard ruler.

Example of Implementation of the D Scale

The D Scale can be completely implemented in software, in hardware or in both software and hardware.

Consider the case of post-acquisition data analysis mentioned earlier. Then, the scale, with its associated mapping, can be implemented, along with sampling, entirely in software, on already acquired data. Such is commonly the case in medical imaging or seismology, to touch on a few general application domains. Or, consider the case of real-time data acquisition, say in radar. Then it can be implemented entirely in hardware such that the sampling is automatically performed in real-time, as data is received by a data acquisition device. Or the scale's points can be mapped to the D scale in software, while its associated sampling algorithm is implemented in hardware.

The example includes:

1. A set of prime numbers used to comprise the scale's multi-resolutions. The set is selected with the aim to bound the range of resolutions, according to an application domain constraint, with as few points as needed.

2. Set of points in the scale as the union of points in each of the scale's resolutions.

3. Distances between adjacent points on scale. It is saved in-memory or elsewhere.

4. Sampling algorithm.

Calculating the N Dimensional Fourier Transform Using the D Scale

The underlying mathematical foundation of many diverse applications includes the Fourier Transform. These applications are in such diverse domains as signal processing to include digital signal processing (DSP), image processing, scientific and engineering computational applications, data acquisition and statistical data analysis. But there are several difficulties in actually applying the Fourier Transform directly to measurement samples.

Therefore in practice, several approximations of it are routinely used instead. They include the Discrete Fourier Transform which is typically calculated using the FFT family of algorithms, the Discrete Cosine Transform and others. There have been many attempts at calculating the Fourier transform of a function using irregular samples.

The problem is then to calculate an accurate spectrum approximation of the following Fourier transform (using the time-frequency analog):

$$F(\omega_m)=1/(2\pi) \int h(t) \exp(-i\omega_m t)dt$$

given a non-uniformly spaced set of time samples.

Part of the problem of calculating the transform is to provide feedback on how good the approximation is, given the set of sample points applied. The algorithm also can provide guidance on whether a redeployment of those sample points provide a more accurate spectrum. Further, it can be used to determine whether more sample points are needed to gain noticeably increased accuracy, or whether the point of diminishing returns has been reached.

The present invention is used to provide a closed form set of equations, to calculate the Fourier transform of a complex valued function given a (finite or infinite) set of non-uniformly spaced sample points. The algorithm can also be applied without change to its procedural structure, to calculate similar transforms, such as, but not inclusively, the Harley transform, Discrete Cosine Transform (DCT), Fourier series. The algorithm is fast because it expresses the Fourier transform as a series of Fast Fourier Transforms (FFT).

The Fourier transform is calculated by starting with first principles, from the definition of a Riemann Integral of a multi-dimensional function. The Riemann partition used to approximate the integral (say as an area under a curve), is determined by the set of measurement points in a time domain D scale. Also, the set of frequency components calculated is determined by a set of measurement points on a frequency domain D scale. Finally, the Shannon Sampling theorem is applied to calculate the approximate time domain ,function that corresponds to the just calculated frequency spectrum.

The Fourier Transform of a function is expressed as a sum of band limited functions. Each of these band limited functions is derived from a subset of points in the D scale associated with one of its prime scales. Because of that, each of the bandlimited functions can be calculated efficiently using the standard FFT. Therefore, the Fourier Transform can be calculated with the same order of efficiency as FFT. Further, because each function component is bandlimited, each one can be calculated using the Shannon Sampling Theorem (which relies on the Nyquist Sampling Theorem to reconstruct an original object from its bandlimited sample points). Therefore, an approximation of the original object can be reconstructed from the set of all components, providing the necessary feedback on the degree of likeness to the original object. Then, the sampling can be adjusted according to the desired accuracy, by changing the sample point deployment and possibly adding more samples.

Figure 5:
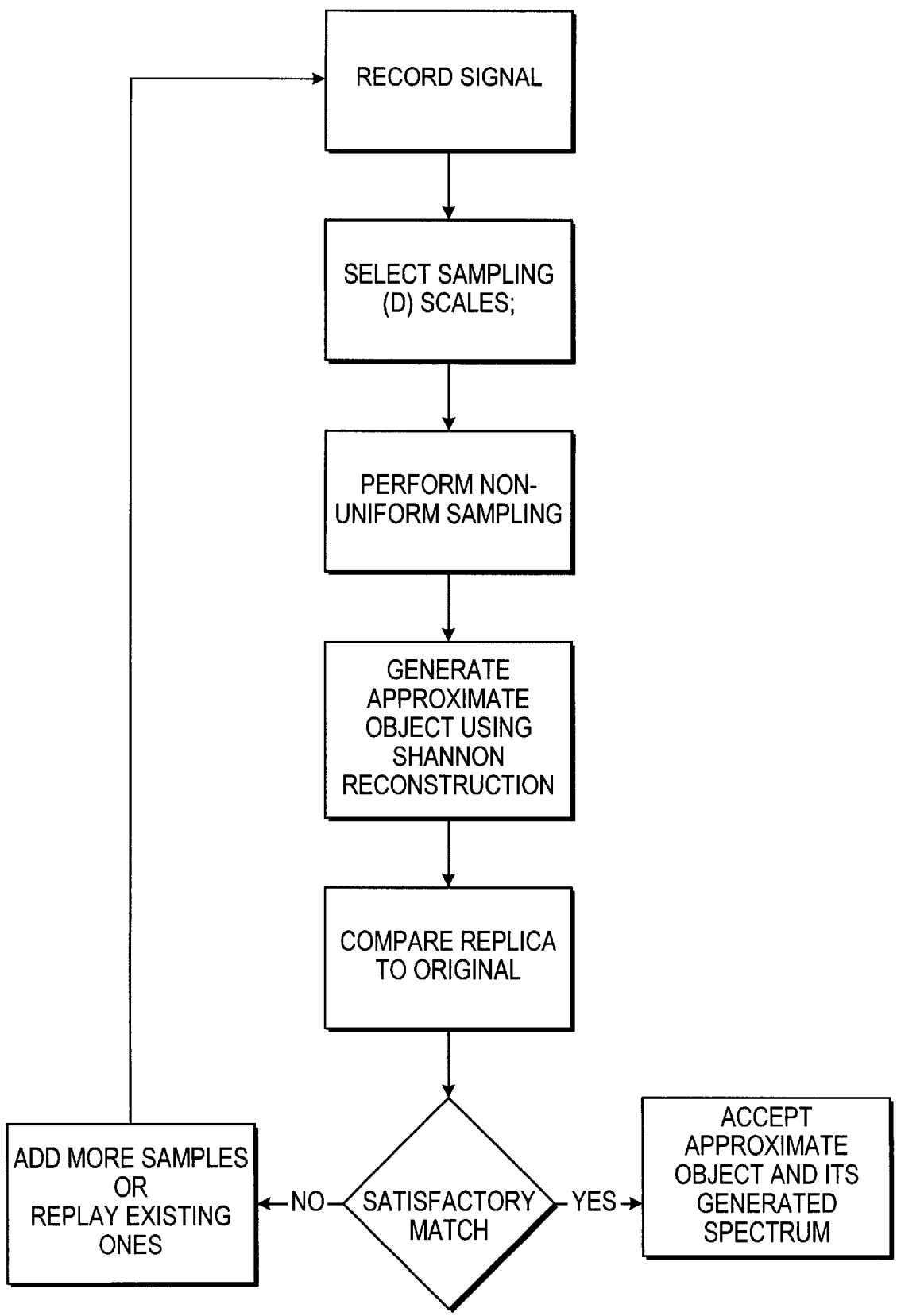
FIG. 5 depicts the steps of the process for calculating the Fourier transform spectrum of an object.

The steps of the process are depicted in FIG. 5 illustrating the iterative steps to approximate the Fourier Transform of an object (in N dimensions), using the sample points available.

This Fourier Transform calculation can only meaningfully calculate as many points in the frequency spectrum as are available sample points. That is, it is not possible to generate more information than what was provided. This constraint is readily expressed by the following matrix equation:

Frequency vector=Fourier Decomposition Matrix*Time Sample Vector[$\omega_0 \ldots \omega_{N-1}$]=$M\times$[$t_0 \ldots t_{N-1}$]

This equation shows how the set of derived points in a spectrum is structurally related to the sampled point inputs. The detailed nature of this matrix structure follows. The points in the frequency vector are determined according to the Reciprocity theorem. This theorem states that:

If A is the scale bound in one domain (typically time), $\Omega$ is the scale bound in a second domain (typically frequency), and N is the total number of samples in the first domain, then:

$$A*\Omega=N.$$

An alternate formulation is:

If $\Delta t$ is the sampling interval in one domain (typically time), $\Delta f$ is the interval in a second domain, (typically frequency), and N is the total number of samples in the first (time) domain, then $$\Delta t*\Delta f=1/N$$

Consider sampling a signal on prime scale p, for $T_p$ time intervals, where $T_p$ is a prime number. Then the boundary is $T_p$. Then $\Delta t=1/p$ where p is the subscale's prime sampling rate and the number of samples $N=T_p*p$ on subscale p. On the frequency side the roles are reversed. $\Delta f=1/T_p$ on subscale $T_p$. Let p represent the sampling rate of a D Scale's prime subscale.

This structure satisfies the reciprocity theorem.

$$\Delta t^* \Delta f \to 1/p^* 1/T_p = 1/(T_p{}^*p) = 1/N$$

The set of derived frequencies is then related by the reciprocity theorem to the sample points by a one-to-one correspondence between time subscales and corresponding frequency subscales.

These calculations then yield an expression for the Fourier Transform decomposition for each frequency subscale characterized by $T_{pi}$ for each corresponding frequency subscale:

$$F(2\pi m/T_{pi}) = \text{Real}(2\pi m/T_{pi}) + i\text{Imaginary}(2\pi m/T_{pi})$$

or $$F(2\pi m/T_{pi}) = |F(2\pi m/T_{pi})| \exp(-i\theta)$$

Where:

$$|F(2\pi m/T_{pi})| = \text{SQRT}[\text{Imaginary}(2\pi m/T_{pi})^2 + \text{Real}(2\pi m/T_{pi})^2] - \text{Amplitude}$$

$$\theta(2\pi m/T_{pi}) = \text{Arctan}(\text{Imaginary}(2\pi m/T_{pi})/\text{Real}(2\pi m/T_{pi})) - \text{Phase}$$

IF:

$$F_n(\omega_m) = \frac{1}{2}\pi \int_{-\infty}^{+\infty} h(t) e^{-i\omega_m t} dt = \frac{1}{2}\pi \int_0^{T_{\rho \max}} h(t) e^{-i\omega_m t} dt$$

THEN:

$$|F(2\pi m/T_{p_i})| = \frac{1}{2}\pi \sum_{k=\{\min \text{ prime}\}}^{\{\max \text{ prime}\}} \sum_{n=0}^{n=(T_{pk}*p_k)-1} \delta_{pk,n\%pk} h(n/p_k) e^{-i2\pi\left(\frac{T_{pk}}{T_{pi}}\right) nm/T_{pk}*p_k}$$

where:

The prime scales associated with prime numbers $p_i$ are components of a D Scale $T_{p\,i}$ is the observation length, in units of time, on prime scale $p_i$.

$T_{p\,i}$ must be a prime number. $T_{pmax}$ is the maximum value.

m=0, ... $T_{pi}$ –1 for each frequency prime scale $T_{pi}$ where k=min to max prime scales.

$\delta_{pk,n\,\%pk}$ is the interval between a point on the D Scale located by ($p_k$, n $\%p_k$) and its next, right, nearest neighbor on the same D Scale. (% is an operator extracting the non-integral part of a fraction.)

{max prime} has a greater bandwidth than the function being transformed. Σ' is a sum over the prime numbers in the scale.

If the original signal, h(t) is expressed as a complex function $h(t) = h_r(t) + i\,h_i(t)$
then:
{max prime} n=$(T_{pk}*p_k)-1$
Real$(2\pi m/T_{pi}) = \frac{1}{2}\pi \Sigma' \Sigma \delta_{pk,n\,\%pk} h_r(n/p_k) \cos(2\pi(T_{pk}/T_{pi})nm/T_{pk}*p_k) + \delta_{pk,n\,\%pk} h_i(n/p_k) \sin(2\pi(T_{pk}/T_{pi})nm/T_{pk}*p_k)$
k={min prime} n=0

Imaginary$(2\pi m/T_{pi}) = \frac{1}{2}\pi \Sigma' \Sigma \delta_{pk,n\,\%pk} h_r(n/p_K) \cos(2\pi(T_{pk}/T_{pi})nm/T_{pk}*p_k) + \delta_{pk,n\,\%pk} h_i(n/p_k) \sin(2\pi(T_{pk}/T_{pi})nm/T_{pk}*p_k)$ Discussion of Closed Form Solution Consider the innermost terms in the Fourier Transform Decomposition:

n=$T_{pk}*p_k-1$
$\Sigma\,\delta_{pk,n\,\%pk} h(n/p_k) e^{-i2\pi(T_{pk}/T_{pi})nm/T_{pk}*p_k}$
n=0

Each such term has the form of a Discrete Fourier Transform. Therefore the efficient Fast Fourier Transform (FFT) algorithms can be applied to each of these terms. Note that there is an additional term in the exponent, (Tpk/Tpi), which is integral to the invention. But this is a constant for the series and does not change the FFT structure.

Another point to consider is that although the outer summation appears to be unbounded, it is bounded in any physical situation. That is, only a finite number of prime scales need to be included in the D Scale, because no physical process can have an infinite bandwidth. Practical constraints also dictate realistic bandwidths as well. Thus, a voice application does not need generally need to consider a base bandwidth of higher than 20 KHz.

Yet another point is that this equation quantifies just how much is thrown out by the standard approximation of a Fourier Transform by a Discrete Fourier transform. Indeed, all but one prime scale is disregarded in the usual approximations. Therefore, the noticeable accuracy that must result from including the multi-resolutions will have real impact on the many commercial applications that are based on the Fourier Transform.

Finally, because this decomposition is derived from first principles, it preserves the phase as well as amplitude of the original Fourier transform.

There are many practical ways to sample data using the D Scale, and then to calculate the Fourier transform. The varied approaches depend on operating circumstances, such as real-time vs. post-data acquisition analysis, or available a-priori knowledge or not, as well as other cases. An embodiment is given below to highlight one manner by which the D Scale is used to calculate the Fourier Transform of sampled data during signal processing.

Practical Example of Processing a One Dimensional Signal

An example is presented that implements the use of the D scale in signal processing. Although the invention is applicable to multidimensional signals and images, etc. from many fields, a preferred embodiment will be described for a weak, sudden, signal over a telephone wire pair having a small bandwidth.

The typical signal of this type has an exponential decay. This particular shape has a spectrum that is directly derivable from its Fourier transform. Its exact spectrum serves as a benchmark to compare the relative accuracy of the usual, textbook, Discrete Fourier Transform approximation against this invention.

Two results emerge from this example. One is that the usual, textbook, approach requires many more uniformly spaced samples, yet still does not generate an accurate replica of the benchmark spectrum of the sound signal. Second, this invention uses far fewer points and does yield an accurate spectrum, comparable to the original.

This benchmark then validates this invention's methodology and decomposition equation.

Figure 9:
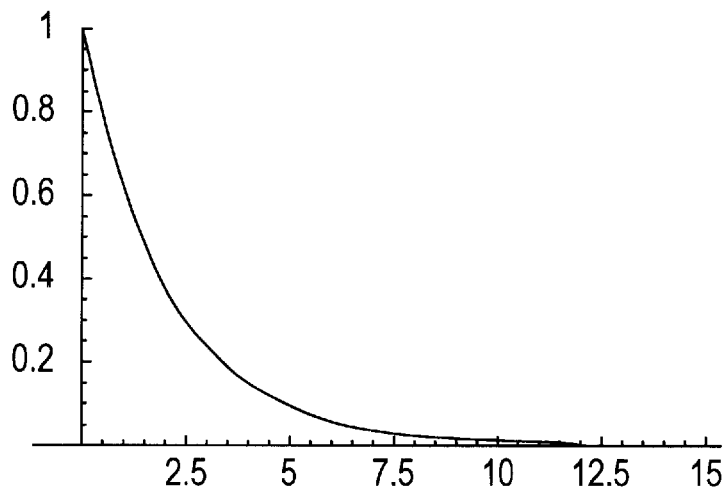
FIG. 9 depicts a benchmark signal used to evaluate the efficiency of the invention.

FIG. 9 shows the signal whose spectrum will be extracted. In order to demonstrate the effectiveness of the invention the benchmark signal was reproduced in a closed analytic form using Mathematica.

Figure 10:
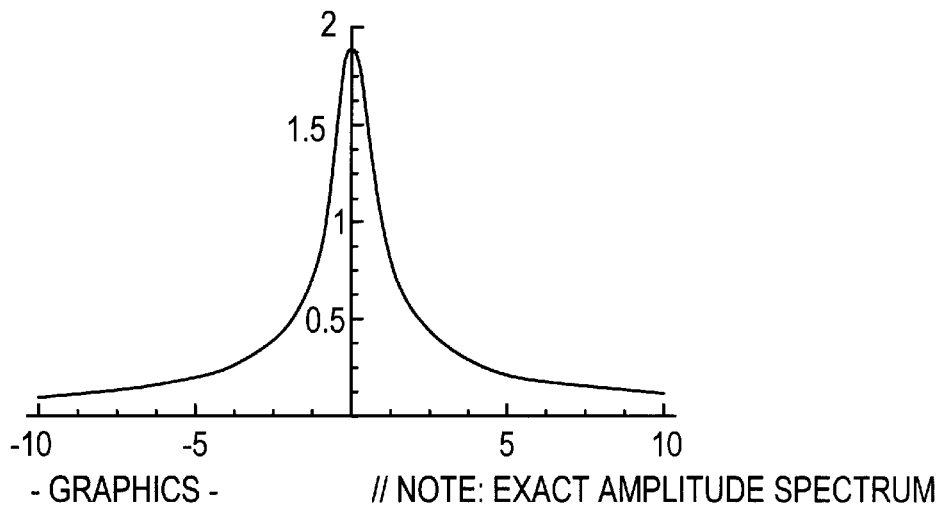
FIG. 10 depicts the exact spectrum of the benchmark signal of FIG. 9.

FIGS. 10*a*–*b* are the mathematically exact spectrum of FIG. 9 to which will be compared the methodology of the prior art and of the invention.

Result of Prior Art Approximation of Signal

The Fourier Transform cannot be generally applied directly to data sets, uniform or not. One barrier is that data sets cannot, in the vast number of cases, be expressed in a mathematically tractable form. More important, the exponential term in the Fourier Transform causes partial to complete cancellation of terms generated from uniform sampling, leading to inaccurate spectrum calculations.

These limitations notwithstanding, the usual approach is to approximate the Fourier Transform by a Discrete Fourier Transform (DFT) on uniformly spaced data. However, if the uniform rate is lower than the maximum possible bandwidth, then vital information could be lost in the calculated spectrum. Therefore the uniform sampling rate is set to the Nyquist bandwidth. This employs only one term of many that the invention will utilize:

$$F(2\pi m/T_{pi}) \approx \frac{1}{2}\pi \sum_{n=0}^{T_{pk}*p_k} h(n/p_k)e^{-i2\pi nm/T_{pk} \cdot p_k}$$

Figure 11A:
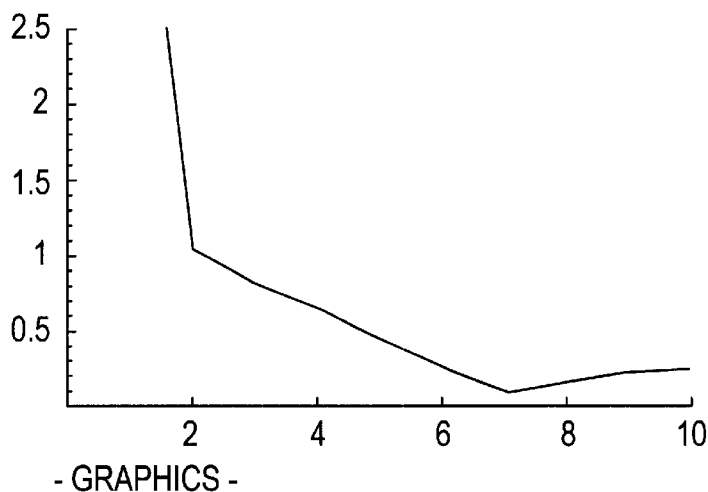
FIG. 11a depicts the amplitude spectrum of the benchmark signal arrived at by using Mathematica's Fourier function.
Figure 11B:
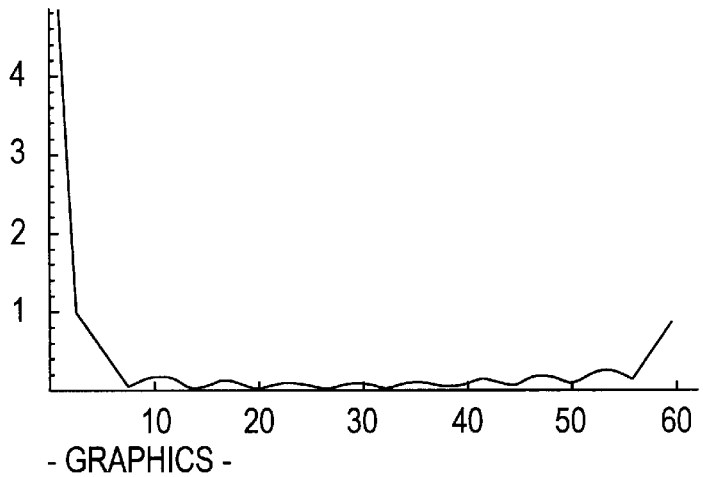
FIG. 11b depicts the amplitude spectrum as a function of $\omega$, across its entire range.

The calculated spectrum is arrived at by using Mathematica's Fourier function. As may be seen from FIG. 11, this differs markedly from the exact spectrum in FIG. 10. Note, in particular, that the amplitude at 0 is much greater than the expected value of 2. Also note that the curvature in the lower left hand corner differs from the exact spectrum.

Description of the Non-Uniform Sampling Device

A measuring device is used to generate real-time, non-uniformly spaced samples, of a sudden sound over a telephone wire pair. The basic wire-pair telephony audio range has a 4 KHz baseband bandwidth. But the sound is weak enough that the effective base bandwidth is about 6 Hz. There is no loss in generalization, using this low frequency.

Figure 4:
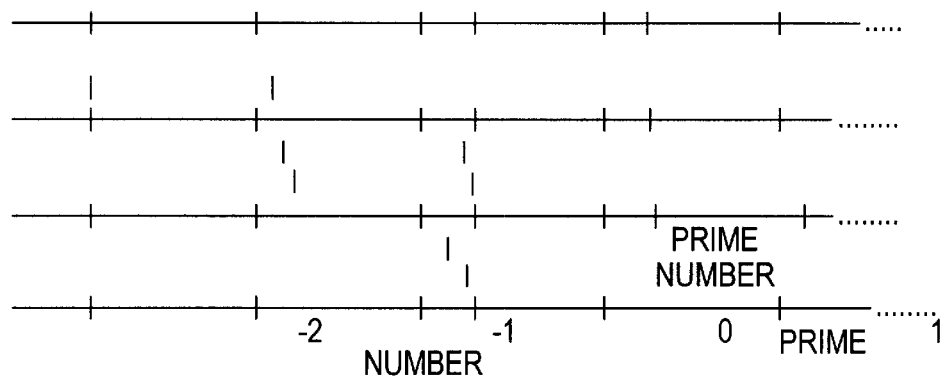
FIG. 4 shows an unbounded, 1D, multi-resolution composite D scale.

Non-uniformly spaced samples are generated by a measuring device that dynamically changes its sampling rate based on the volatility of its most recent samples. That is, it generates more samples when recent samples suggest higher volatility, and far fewer samples where the time series is relatively constant. It does this by superimposing initial uniform sampling rates with new sampling rates that it activates when volatility increases. This provides a multi-resolution sampling effect. FIG. 4 shows how this device can be constructed using off-the-shelf components.

Invention's Spectral Determination of Non-Uniformly Sampled Input Signal

Consider the original signal as shown in FIG. 9. Its most volatile region is between 0–2 followed by 2–5 time units. Lastly, the region between 5–11 is relatively constant, without much information. therefore the non-uniform sampling device constructed above is programmed to partition the incoming data into three D scale subscales, at rates 1/11, 1/7, 1/3.

The initial rate is 1/3 for the entire 11 time units. The 1/7 rate is applied only until the volatility reaches a low enough threshold, or 5 time units. Finally, the highest sampling rate of 1/11 is only applied for the first 2 time units, where volatility is highest.

The D scale is constructed from the selected prime sampling rates, noted in the previous section. The first step creates the D scale's prime subscale vectors, in this case three. The Mathematica 'N' operation calculates decimal values from the fractions. These subscales are then joined and then most importantly, sorted from low to high numeric values. This step effectively mixes the values from the prime subscales. Then identical entries are removed. This occurs because each unit interval is a part of each scale, like 1,2, etc. Finally, as a Mathematica artifact, the last entry in the temporary, intermediate, scale is appended.

Do[sp[i]=N[table[(n−1)/p[[i]], {n, 1, p[[i]]pt[[i]]}]], {i, Length[p]}];
scaleTmp=Sort[Flatten[Join[Table[sp[i], {i, 1, length[p] }]]]];
scale=Table[Null, {0}];
Do[If[UnsameQ[scaleTmp[[i+1]], scaleTmp[[i]]]scale= Append[scale, scaleTmp[[i]]], Null], {i, 1, Length [scaleTmp]−1}];
scale=Append]scale, scaleTmp[[Length[scaleTmp]]]];

creates the D scale. The intervals or widths between adjacent D scale points is calculated:

delta=Table[scale[[*i*+1]]−scale[[*i*]], {*i*, 1, Length[scale]−1}];

The values of the original signal are calculated at the D scale points. Non uniform sampling at the scale points is determined by

*h*=Table[Exp [−.5 scale[[*i*]]] UnitStep[[*i*]]], {*i*, 1, Length[scale]− 1}];

The D scale is indexed into its prime subscales. This is a programming artifact, not intrinsic to implementing the algorithm. The aim here is to effectively unmix the values in the D scale (due to the sort operation above), and place their D scale locations, or indexes, into their associated prime subscale. Each subscale vector is generated by first locating its members in the D scale. A member is identified if the product of this subscale's prime value and a scale value is an integer. Then, that member's D scale index is placed in the subscale array by:

Clear[b]
Do[
  Do[
    If[
      IntegerQ[
      Rationalize[
        scale[[n]] p[[m]]
      ]
    ],
    b[m]=Append[b[m], n],
    Null
  ], {n, Length[scale]}
], {m, Length[p]}
];

This step adjusts the index vectors created above. It removes those boundary scale entries like 1,2,etc. that were placed in each subscale. These scale points are assigned arbitrarily to one of the subscales only, in this case the first. Then it is removed from the other subscales. Again, this is a programming artifact and would not be necessary if another implementation approach were taken.

Finally, the implementation of Σ S is:
Do[f[1]=
  Table[
    {2Pi m/pt[[1]],
      Abs[
      Sum[
        Sum[

```
        h[[ c[k][[n]] ]]
        delta[[ c[k][[n]] ]]
        Exp[
           -2Pi (pt[[k]]/pt[[l]])
           (nm)/(p[[k]]pt[[k]]) I
        ]
        , {n, 1, Length[c]]-1}
        ]
     ]
   }
   , {m, 0, Length[c[1]]}
   ]
   , {l, 1, Length[p]}
];
```
the decomposition equation is implemented, now that the data structures are in place. Following the structure of the implementation, a set of frequency amplitude vectors is generated, from the sets of sampled values in the D scale's prime subscales, again in this case three. The frequency vector is denoted f[l], where l is indexed from 1 to Length [p], or three in this case. The D scale values are fetched indirectly via the c[ ] vector created in a previous step. Thus, h[ c[k][[n]] ] is the value of the original signal 'h' at the scale point located by its location in prime subscale vector c[k], at position n in that vector.

The amplitudes of these newly generated frequency vectors f[l] are plotted, to highlight the underlying approach of generating each subscale of the spectrum's D scale. The Mathematica 'N' operation calculates decimal values from the complex numbers whose real and imaginary components are expressed as fractions.

Figure 14:
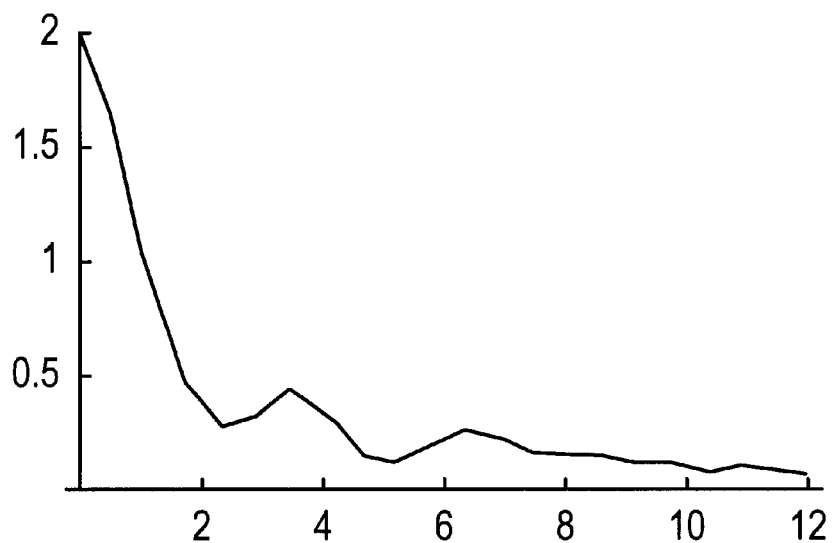
FIG. 14 depicts the amplitude plot of the spectrum contribution from the D scale using prime 11.

Finally, the spectrum is plotted by juxtaposing the contributions from each of the spectrum D scale's prime subscales (each of which is shown in FIGS. 12–14).

Figure 15:
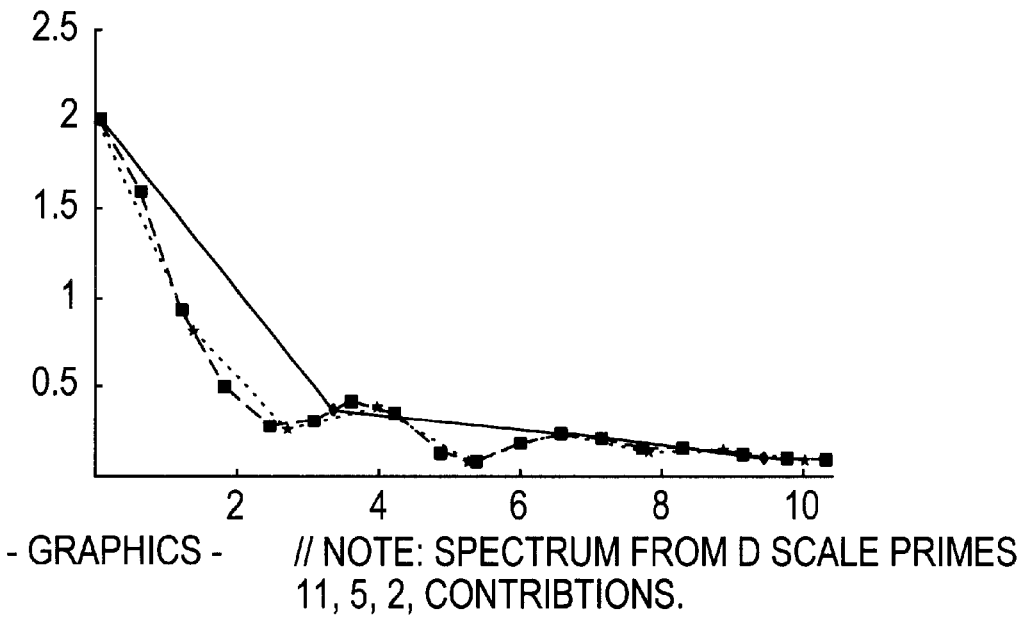
FIG. 15 depicts the spectrum from D scale primes 11, 5, and 2 contributions.

Note that it accurately replicates the original spectrum from 0–10. Specifically, it has a value of 2 at 0, and its curvature is very similar to the original. Thus, the value of 0.5 is reached at about 1.75, as in the original. And the value of 1 is reached at about 1 on the x axis, again as in the original spectrum. See FIG. 15. Thus the result of the present invention is excellent compared to the prior art.

Figure 16:
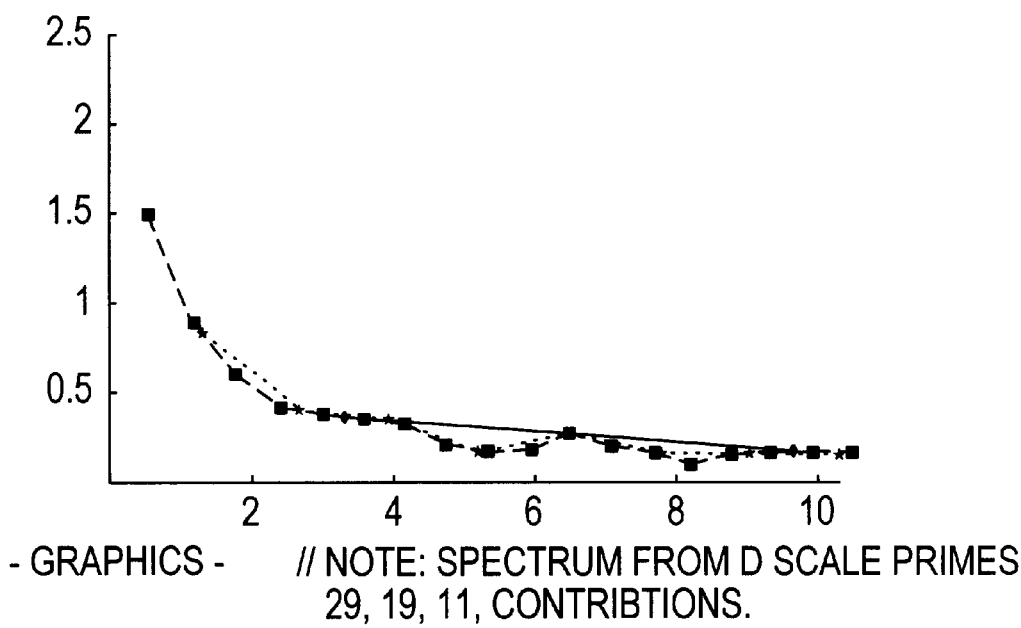
FIG. 16 depicts the spectrum from D scale primes 29, 19, and 11 contributions.

Finally, the spectrum was recalculated (see FIG. 16) using more data samples, at higher rates. The primes used were:

p={29, 19, 11} instead of p={11, 7, 3}

The sampling time intervals remained the same as in the prior case. Note that it also generates an authentic replica of the original spectrum. But, as expected, it is smoother than the previously generated one because more sample points are applied. The point at value 0 is not indicated, although it would be the correct value of 2, because the code used inadvertently started from the next to first index, not the first scale index. In practice the difference between a physical signal and the sampled transformed result may be calculated and from the difference it may be determined whether to recurse the sampling process while increasing the set of distinct primes.

Advantages of the D Scale

The advantages of using the Druck Scale are apparent when comparing the benchmark, textbook and invention calculation results.

e. The number of sample points required is dramatically smaller than using the textbook approach. For it required a high data sampling rate, at twice the maximum bandwidth, throughout the measurement period.

f. The results are much more accurate because it does not rely on the coarse Discrete Fourier Transform approximation. In fact, as the closed form expression indicates, the DFT approximation is really one of many DFT components of the Fourier Transform above. That is, the invention shows that the standard approximation throws out most of the relevant terms.

g. The invention is faster because fewer points are used in the calculation. And the invention shows how the calculation is comprised of decoupled terms, each with the FFT form. Therefore the FFT efficiency can be applied, as well as parallel processing optimizations.

h. The invention also enables the phase of the spectrum to be accurately calculated, because it relies on first principles. This is quite important for many applications, where phase is the determining factor in designed or observed behavior.

Although the invention has been described in view of particular embodiments, the scope of the invention should be determined by the following claims:

What is claimed is:

1. A method for producing a sampled copy of a physical signal for signal processing, primarily digital signal processing, by
    sampling the signal at discrete points of a D scale, wherein said D scale comprises the union of n sets of points, each set being points separated by regular intervals of $1/p_n$ where $p_n$ is a prime number.

2. A method for generating the Fourier transform of a physical signal comprising
    (a) sampling the physical signal at discrete points of a D scale, wherein said D scale comprises the union of n sets of points, each set being points separated by regular intervals of $1/p_n$ where $p_n$ is a prime number, and
    (b) transforming said sampled values into points in another parameter domain by a series of Discrete Fourier Transforms.

3. The method of claim 2, wherein said Discrete Fourier Transforms are calculated using Fast Fourier Transforms (FFTs).

4. The method for generating the Fourier transform of a physical signal of claim 2, further comprising
    (a) computing the difference between the physical signal and the sampled, transformed result,
    (b) determining from the difference computed in (a) whether to increase the resolution by recursing and increasing the set of distinct primes.

5. The method of claim 2 wherein kernel functions are integrated in the transform.

6. The method of claim 5, wherein the kernel functions are chosen to produce the Radon Transform, Hartley transform, and Discrete Cosine Transform.

7. The method of claim 6 wherein said method is implemented in a real-time data measurement environment.

8. A method for signal processing, primarily digital signal processing, by sampling the signal at discrete points and transforming the values into an N dimensional Fourier transform, comprising
    selecting discrete points of a D scale at which sampling occurs, wherein said D scale comprises the union of n sets of points, each set being points separated by regular intervals of $1/p_n$ where $p_n$ is a prime number
    transforming the sampled values into the coefficients of a Fourier transform of the signal,
    determining the accuracy of the transform and if necessary recursing and increases the set of distinct primes.

9. The method of claim 8 wherein said transformation employs a Fast Fourier Transform analysis of the data.

10. The method of claim 8 wherein said method is implemented by running a series of clocks ticking at intervals characterized by $1/p_n$ for the $n^{th}$ clock, and sampling the signal at each clock tick.

11. The method of claim 10 wherein the signal is characterized by multiple parameters, the steps of the process being repeated separately and independently for each parameter.

12. The method of claim 11 wherein a sampling space is formed as the Cartesian product of one dimensional spaces.

13. The method of claim 10 wherein the signal is characterized by multiple parameters, the steps of the process being repeated separately and concurrently for each parameter.

14. The method of claim 13 wherein a sampling space is formed as the Cartesian product of one dimensional spaces.

15. The method of claim 8 wherein the physical signal is characterized by multiple parameters, the steps of the process being repeated separately and independently for each parameter.

16. The method of claim 15 wherein a sampling space is formed as the Cartesian product of one dimensional spaces.

17. The method of claim 8 wherein the signal is characterized by multiple parameters, the steps of the process being repeated separately and concurrently for each parameter.

18. The method of claim 17 wherein a sampling space is formed as the Cartesian product of one dimensional spaces.

19. The method of claim 8 wherein said signal is a time series originating an electrical, optical, or other physical process, wherein the sampling occurs at time or other parameter values selected from a D scale.

20. The method of claim 8 wherein said signal is a series resulting from data processing on any kind of physical data, wherein the sampling occurs at time or other parameter values selected from a D scale.

21. The method of claim 8, wherein the sampled object is a multidimensional object, and wherein the signal comprises N independent variables each of which is measured at D scale values comprising a multi-dimensional coordinate system.

22. The method of claim 21 wherein the multidimensional object is embedded in a multidimensional space and the D scale values parametrize the space in which the object is embedded.

23. The method of claim 8, wherein the method is applied to data acquisition in one or more dimensions.

24. The method of claim 23, wherein the method is applied after data has been acquired.

25. The method of claim 24 wherein the acquired data is produced by NMR or tomography devices.

26. The method of claim 24, wherein the acquired data is produced by seismographic measuring devices.

27. The method of claim 8, wherein the method is applied in real-time.

28. The method of claim 8 wherein the D scale is used to partition or create multiple components of physical, irregularly patterned, data.

29. The method of claim 28, wherein said partition contains periodically patterned data from physical samples.

30. The method of claim 29, wherein said data is band-limited data from the physical samples.

31. The method of claim 30, wherein each partition has a different resolution such that the partitions form a nested set of resolutions.

32. The method of claim 28, wherein each partition has a different resolution such that the partitions form a nested covering set of non-overlapping points.

33. The method of claim 32, wherein each partition has a different resolution such that the partitions form an infinite nested covering set of non-overlapping points.

34. The method in claim 28 wherein a maximum and minimum resolution of the nested partitions is predetermined such that neighboring points in the combined partitions have an interval between the specified minimum and maximum resolutions.

35. The method of claim 8, wherein the data comprises random noise, and the n sets of points filter the random noise into periodic components.

36. The method of claim 35 further comprising the step of processing the periodic components.

* * * * *